United States Patent
Froeschl

(10) Patent No.: US 11,297,749 B2
(45) Date of Patent: Apr. 5, 2022

(54) METHOD FOR TRANSPORTING AND INSTALLING AN ELECTRONIC DEVICE, AND REUSABLE TRANSPORT AND ASSEMBLY MODULE

(71) Applicant: Bayerische Motoren Werke Aktiengesellschaft, Munich (DE)

(72) Inventor: Joachim Froeschl, Herrsching (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 16/969,009

(22) PCT Filed: Mar. 21, 2019

(86) PCT No.: PCT/EP2019/057020
§ 371 (c)(1),
(2) Date: Aug. 11, 2020

(87) PCT Pub. No.: WO2019/206529
PCT Pub. Date: Oct. 31, 2019

(65) Prior Publication Data
US 2021/0029856 A1  Jan. 28, 2021

(30) Foreign Application Priority Data

Apr. 27, 2018  (DE) .................. 10 2018 206 546.2

(51) Int. Cl.
*H05K 13/00* (2006.01)
*H05K 13/04* (2006.01)
(Continued)

(52) U.S. Cl.
CPC ....... *H05K 13/0084* (2013.01); *H05K 7/1401* (2013.01); *H05K 13/0434* (2013.01);
(Continued)

(58) Field of Classification Search
CPC .......... H05K 3/30; H05K 3/301; H05K 3/306; H05K 3/326; H05K 5/0026; H05K 5/0069;
(Continued)

(56) References Cited

U.S. PATENT DOCUMENTS 6,195,876 B1 *  3/2001  Koyama .............. H05K 13/028
29/740
2009/0016007 A1  1/2009  Chen
2014/0198473 A1  7/2014  Shah et al.

FOREIGN PATENT DOCUMENTS

CN  1561656 A  1/2005
CN  1599061 A  3/2005
(Continued)

OTHER PUBLICATIONS

International Search Report (PCT/ISA/210) issued in PCT Application No. PCT/EP2019/057020 dated Jun. 26, 2019 with English translation (five pages).

(Continued)

*Primary Examiner* — Peter Dungba Vo
*Assistant Examiner* — Joshua D Anderson
(74) *Attorney, Agent, or Firm* — Crowell & Moring LLP

(57) ABSTRACT

A method for transporting and installing an electronic device having at least one first electrical contact element includes fixing the electronic device in a recess or interior of a reusable transport and assembly module such that access to the at least one first contact element is blocked by a protective element, transporting the transport and assembly module and the electronic device into a connection region of an electrical apparatus, removing the protective element so that the at least one first contact element is accessible, actuating an actuation apparatus provided on the transport and assembly module to move the electronic device in a direction out of the recess or interior into a contact position
(Continued)

in which the at least one first contact element is brought into electrical contact with at least one second contact element provided on the electrical apparatus, and removing the transport and assembly module.

15 Claims, 4 Drawing Sheets

(51) Int. Cl.
*H05K 7/14* (2006.01)
*H05K 13/02* (2006.01)

(52) U.S. Cl.
CPC .............. *H05K 13/02* (2013.01); *H05K 13/04* (2013.01); *Y10T 29/4913* (2015.01); *Y10T 29/53174* (2015.01)

(58) Field of Classification Search
CPC .......... H05K 7/12; H05K 7/14; H05K 7/1401; H05K 7/1404; H05K 7/1405; H05K 7/1407; H05K 7/1408; H05K 7/1409; H05K 7/1417; H05K 13/0084; H05K 13/02; H05K 13/04; H05K 13/0404; H05K 13/0408; H05K 13/043; H05K 13/0434; H05K 13/0439; H05K 13/0443; H05K 2203/304; Y10T 29/4913; Y10T 29/49139; Y10T 29/4914; Y10T 29/49147; Y10T 29/49169; Y10T 29/53174; Y10T 29/53178; Y10T 29/53183; Y10T 29/53265; Y10T 29/53548; Y10T 29/5397; Y10T 29/53974; H01R 43/20; H01R 43/205
See application file for complete search history.

(56) References Cited

FOREIGN PATENT DOCUMENTS

| | | |
|---|---|---|
| CN | 101371346 A | 2/2009 |
| CN | 102171802 A | 8/2011 |
| CN | 107123622 A | 9/2017 |
| DE | 295 01 057 U1 | 3/1995 |
| FR | 846 218 A | 9/1939 |
| WO | WO 00/35262 | 6/2000 |

OTHER PUBLICATIONS

German-language Written Opinion (PCT/ISA/237) issued in PCT Application No. PCT/EP2019/057020 dated Jun. 26, 2019 (seven pages).

German-language Office Action issued in German Application No. 10 2018 206 546.2 dated Dec. 19, 2018 (four pages).

Chinese-language Office Action issues in Chinese Application No. 201980015178.4 dated Feb. 1, 2021 (seven (7) pages).

* cited by examiner

METHOD FOR TRANSPORTING AND INSTALLING AN ELECTRONIC DEVICE, AND REUSABLE TRANSPORT AND ASSEMBLY MODULE

The present invention relates to a method for transporting and installing an electronic device according to the features of patent claim 1 and also to a reusable transport and assembly module according to the features of patent claim 15.

There are a large number of "electronic" devices, such as for example control devices, printed circuit boards, memory cards for computers, motherboards, etc., that have at least one contact element (e.g. a thin contact pin) protruding from the electronic device and are not surrounded by a protective housing.

Such electronic devices must be protected from mechanical damage during transport or up until their installation.

The object of the invention is to provide a method for safely transporting and installing an electronic device and also a reusable transport and assembly module suitable for this.

The starting point of the invention is a method for transporting and installing an electronic device that has at least one first electrical contact element. The term "electronic device" should be interpreted extremely broadly. In principle, it is understood as meaning all electronic devices, in particular those on which electronic components or connection elements or contact elements are exposed and at risk of undergoing mechanical damage.

According to the invention, the electronic device is fixed in a recess or an interior space of a reusable transport and assembly module, to be precise in such a way that access to the at least one contact element of the electronic device is blocked by a protective element. "Blocking" should be understood here as meaning that the contact element is "contact-protected", i.e. that it cannot readily collide with other objects during transport, with the intention of thereby avoiding damage.

The electronic device fixed on the transport and assembly module is transported by means of the transport and assembly module into a "connection region" of an electrical device. The term "connection region" should be understood as meaning that region in which the contact element of the electronic device in an installed state is electrically connected to the electrical device.

Before the electrical connecting of the electronic device to the electrical device, the protective element is "removed", so that the at least one first contact element is accessible. In this connection, "removing" does not necessarily mean that the protective element is permanently removed from the transport and assembly module. It is sufficient if the protective element is brought into a state or a position in which the first contact element is accessible.

Subsequently, an actuating device provided on the transport and assembly module is actuated. By actuating the actuating device, the electronic device is moved in a direction that is directed out of the recess or out of the interior space into a contact position, in which the at least one first contact element comes into electrical contact with at least one second contact element provided on the electrical device. As a result, the electronic device is brought into a position that can be referred to as the "installed position". Subsequently, the transport and assembly module can be removed.

In illustrative terms, during the "moving" of the electronic device, the electronic device is displaced such that the at least one first contact element, provided on the electronic device, is brought into a contact position with the assigned at least one second contact element, provided on the electrical device.

According to a development of the invention, the "moving" of the electronic device has the effect of establishing a frictional and/or interlocking connection between the electronic device and the electrical device. The connection between the electronic device and the electrical device may be established by way of at least one connecting element, which has at least one ball or which is formed by at least one ball. This results in a so-called ball clamping connection, which may be a frictional connection and/or an interlocking connection.

For example, the at least one connecting element may be provided on the electrical device, which element interacts with a recess or with a hole that is provided on the electronic device and into which the connecting element is inserted with frictional and/or interlocking engagement.

The connecting element may be for example a ball protruding from the electrical device. The ball may for example be welded on the electrical device. The ball may be for example a plastic ball, which is welded for example by frictional welding on the electrical device, or which is adhesively bonded on the electrical device. In principle, however, balls of another material are also conceivable and suitable.

According to a development of the invention, the actuating device by means of which the electronic device can be moved out of its transporting position in relation to the transport and assembly module has an element arranged rotatably on the transport and assembly module. It may be provided that, by turning the rotatably arranged element, a translational movement of the electronic device in relation to the transport and assembly module can be produced.

According to the invention, it may be provided that the connecting element is provided on the electrical device and a recess interacting with the connecting element is provided on the electronic device, or vice versa.

The electrical device may be for example a device of a vehicle or of a vehicle component that is provided or intended for the production of a vehicle.

The protective element already mentioned above may be arranged movably and preferably captively on the transport and assembly module. For example, it may be provided that the protective element can be moved back and forth between a first position, in which access to the at least one first contact is blocked by the protective element, and a second position, in which access to the at least one first contact element is not blocked by the protective element, or is enabled. The protective element may for example be displaceably arranged on the transport and assembly module. For this purpose, the protective element may for example be displaceable in a groove of the transport and assembly module.

As an alternative to this, the protective element may however also be formed by a removable cover or a protective film, in a way similar to how this is known from yoghurt cups.

According to a development of the invention, a number of first pin- or spike-like contact elements protrude from the electronic device. Accordingly, a number of second contact elements, in which one of the first contact elements can be respectively received, may be provided on the electrical device.

Furthermore, at least one spring element may be provided. In this connection, a spring element should be understood as meaning an element by which the electronic device can be resiliently fixed in the recess or in the interior space of the transport and assembly module with frictional and/or interlocking engagement. The at least one spring element is therefore merely provided for the purpose of holding the electronic device in or on the transport and assembly module "temporarily", i.e. at least during transport.

The at least one spring element is preferably arranged on the electronic device. The at least one spring element may be formed for example by a clamp-like spring element.

As already mentioned above, the subject matter of the invention is not only the method explained above for transporting and installing an electronic device, but also a reusable transport and assembly module suitable for it, for transporting and installing an electronic device. The transport and assembly module according to the invention has a housing-like component, which has a recess or an interior space in which an electronic device is located or into which an electronic device can be inserted. The transport and assembly module also has a protective element, by which the recess or the interior space can be closed when the electronic device is in it.

Furthermore, it has an actuating device, by means of which the electronic device can be moved in a direction that is directed out of the recess or the interior space.

For mass production applications, electronic devices, such as for example control devices, memory cards, etc., can be transported and installed in a robot-controlled manner by means of such a reusable transport and assembly module. For example, it may be provided that a robot removes transport and assembly modules, on which or in which electronic devices to be installed are fixed, one after the other from a transport container. The robot then brings such a transport and assembly module to a connection region of an "electrical device", which may be for example connection bars or contact rails of a vehicle to be produced or of a vehicle component to be produced.

The invention is explained in more detail below in connection with the drawing, in which.

Figure 1:
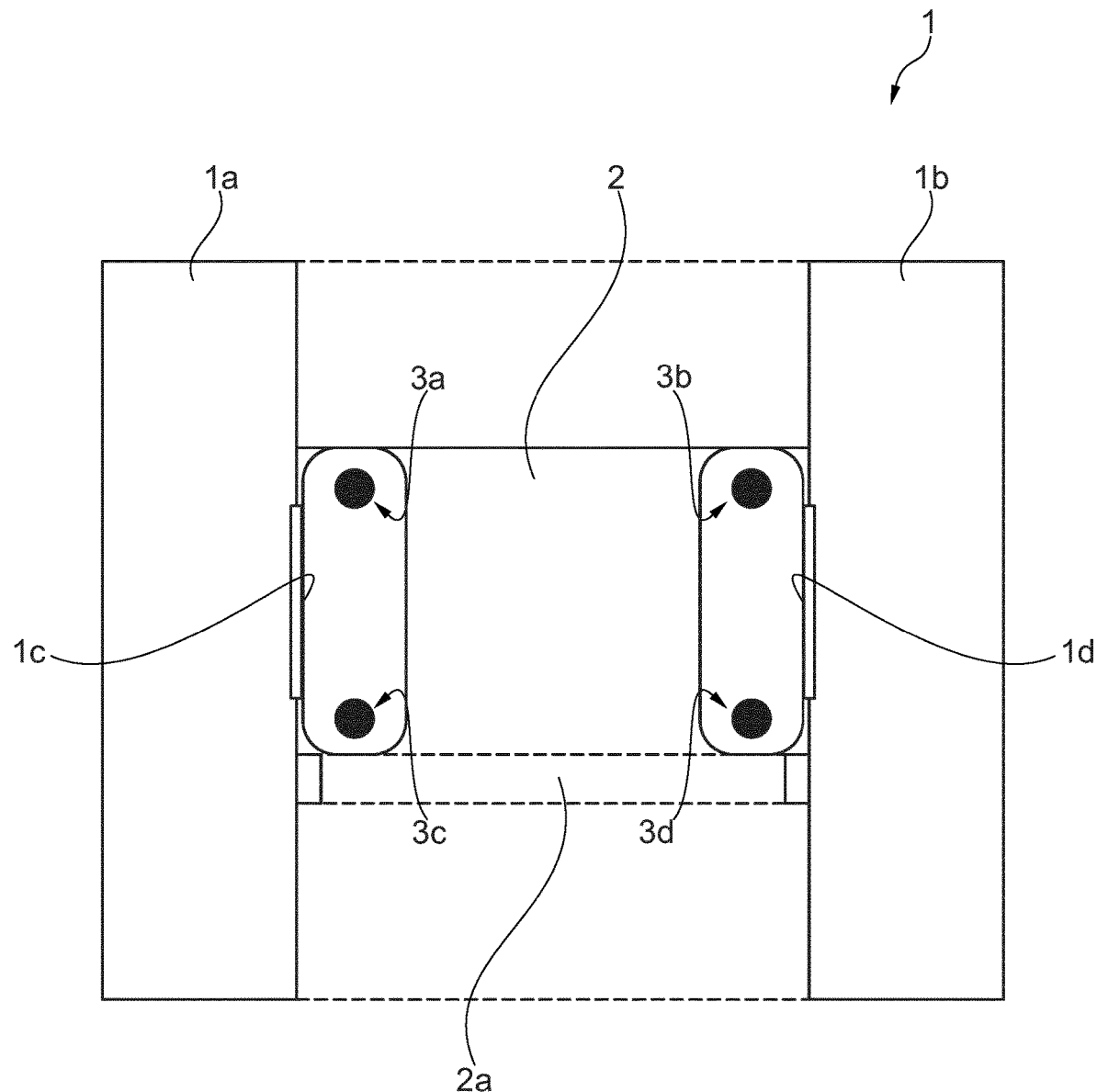
FIG. 1 shows a plan view of an electrical device formed by two supply rails.

FIG. 1 shows an electrical device 1, which has a first electrical supply rail 1a and a second electrical supply rail 1b. Respectively provided on the supply rails 1a, 1b are a contact area 1c and a contact area 1d.

Between the two supply rails 1a, 1b is an electronic device 2, which may be for example a control device, a memory card, a circuit board populated with electronic components, etc. A heat sink 2a may be provided on the electronic device 2.

In the case of the exemplary embodiment shown here, the electronic device 2 is fastened on the electrical device 1 at four fastening points 3a, 3b, 3c, 3d, which are later explained in still more detail.

Figure 2:
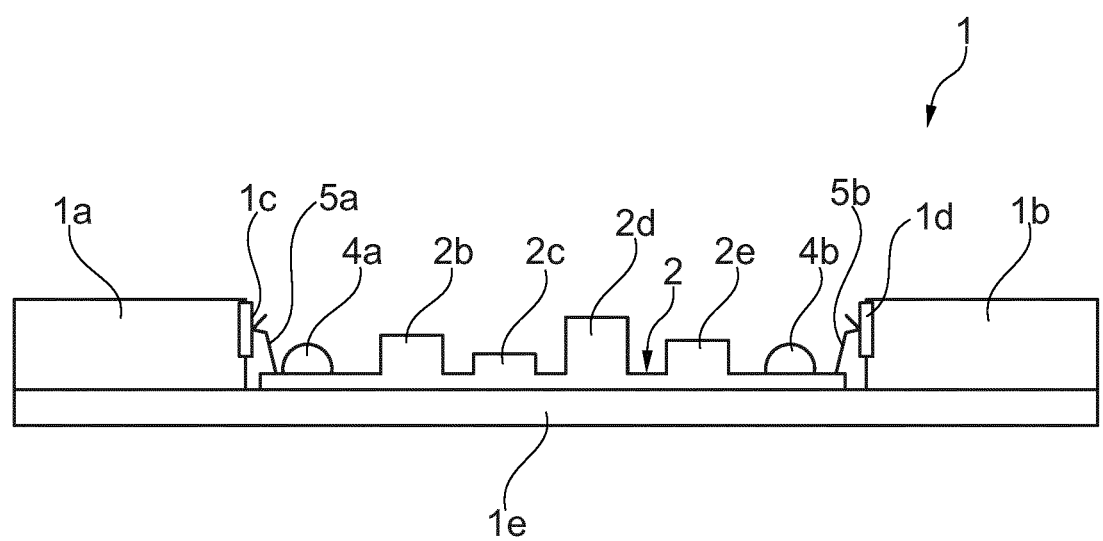
FIG. 2 shows a side view of the electrical device shown in FIG. 1 with an already installed electronic device.

FIG. 2 shows in a side view the electrical device 1 and the electronic device 2 installed on it or on top of it. The electronic device 2 is represented here as a board-like element, on which a number of electronic components 2b, 2c, 2d, 2e are arranged.

The two supply rails 1a, 1b of the electrical device 1 are connected to one another by way of a transverse plate 1e. Respectively protruding upwardly from an upper side of the transverse plate 1e, at the four fastening points 3a-3d (cf. FIG. 1), are a ball 4a and a ball 4b. The two balls 4a, 4b may be welded, adhesively bonded or fastened in some other way on the upper side of the transverse plate 1e. The balls 4a, 4b serve as connecting elements for connecting and fixing the electronic device 2.

For this purpose, through-holes, which are slightly smaller than the diameter of the balls 4a, 4b, are provided in the electronic device 2, or in the board of the electronic device 2, at the fastening points 3a-3d (cf. FIG. 1). The board of the electronic device 2 is flexible, at least to such an extent that the slightly larger balls 4a, 4b can be pressed through the through-holes, whereby a frictional or interlocking ball clamping connection is produced.

As can be seen from FIG. 2, protruding from the upper side of the electronic device 2 are resilient contact springs 5a, 5b, which press against the contact areas 1c and 1d of the contact rails 1a and 1b, respectively, and thereby establish an electrical contact.

Figure 3:
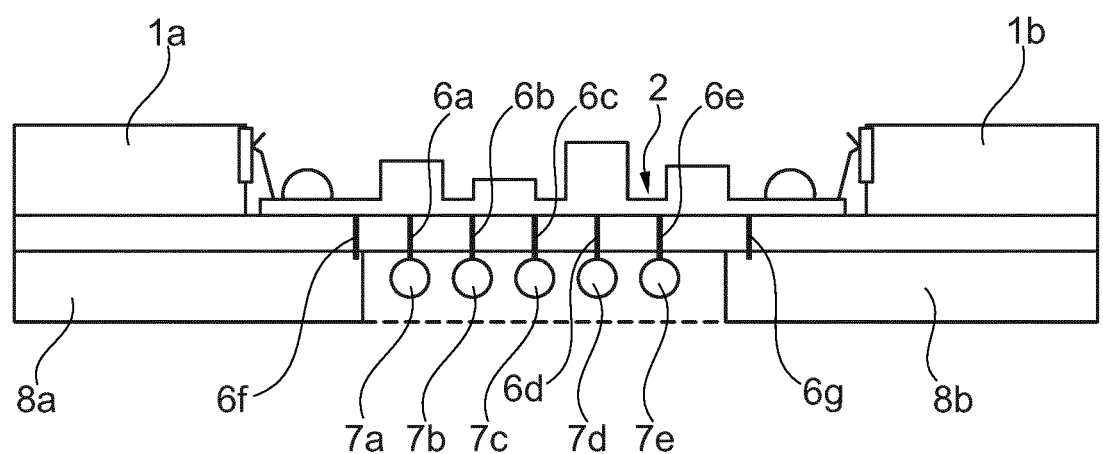
FIG. 3 shows a sectional representation of the arrangement from FIG. 2 in which the electrical contacting can be seen.

FIG. 3 shows a cross section through the arrangement shown in FIG. 2. Protruding from an underside of the board of the electronic device 2 are a number of pin- or spike-like first contact elements 6a-6e, which can engage in second contact elements 7a-7e and electrically contact them. The second contact elements 7a-7e may be connected to data lines of a bus system, for example Can bus, Flex-Ray, etc.

In addition to the first contact elements 6a-6e, further contact elements 6f and 6g may be provided, by way of which the electronic device 2 is supplied with current from additional supply rails 8a and 8b, respectively.

Figure 4:
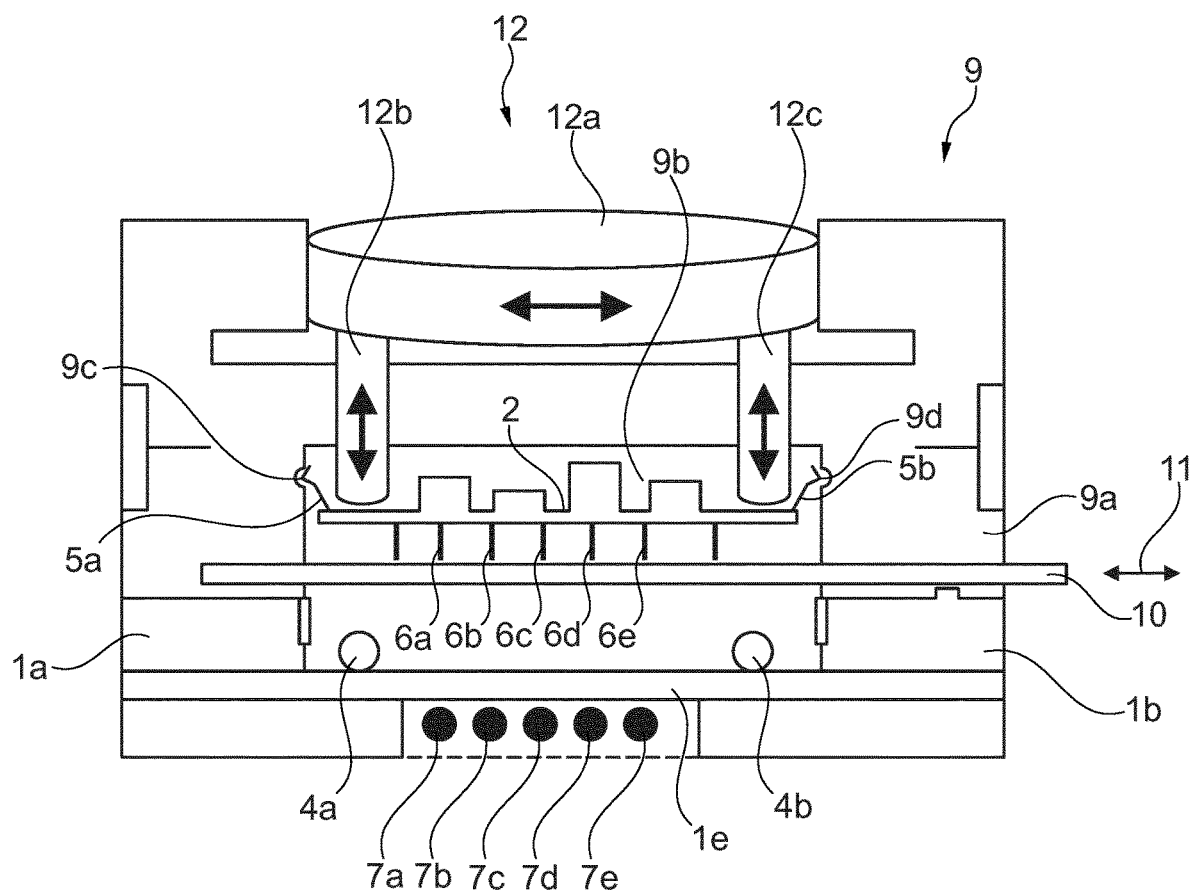
FIG. 4 shows an electronic device, which for transporting is arranged in a transport and assembly module.

FIG. 4 shows a transport and assembly module 9, which has a housing-like component 9a, in which an interior space 9b is provided. The electronic device 2 is arranged in the interior space 9b. The contact springs 5a, 5b of the electronic device 2 engage in latching depressions 9c, 9d, which are provided on an inner side of the interior space 9b. As a result, the electronic device 2 is held in the interior space 9b.

In order to protect the first contact elements 6a-6e from mechanical damage during transport, the interior space 9b, and consequently access to the first contact elements 6a-6e, is blocked by a protective element 10, which is formed here by a plate arranged displaceably in the direction of an arrow 11.

It may be provided that the electronic device 2 is fixed in the transport and assembly module 9 when it is supplied by its manufacturer, the protective element 10 being in the position shown in FIG. 4 in the as-delivered condition.

For installing the electronic device, the transport and assembly module 9, as shown in FIG. 4, is brought up to the electrical device 1 (cf. FIG. 1 or 2). Subsequently, the protective element 10 is displaced laterally in the direction of the arrow 11, whereby access to the first contact elements 6a-6e is enabled.

In a further step, an actuating device 12, which has a rotatable actuating element 12a, is actuated. By turning the actuating element 12a, two press-out pins 12b and 12c are displaced downwardly. The press-out pins 12b, 12c press the electronic device 2 downwardly out of the interior space 9b in the direction of the second contacts 7a-7e. In this case, the electronic device 2 is "pressed" onto the balls 4a, 4b, and is thereby mechanically fixed. At the same time, during further downward pressing, the first contacts 6a-6e respectively engage in the assigned second contact 7a-7e, so that the electronic device 2 is connected not only mechanically but also electrically.

When the intended position of the electronic device 2 has been reached, the transport and assembly module is removed.

What is claimed is:

1. A method for transporting and installing an electronic device, which has at least one first electrical contact element, comprising the acts of:
    fixing the electronic device in a recess or an interior space of a reusable transport and assembly module in such a way that access to the at least one first contact element is blocked by a protective element,
    transporting the transport and assembly module and the electronic device into a connection region of an electrical device,
    removing the protective element, so that the at least one first contact element is accessible,
    actuating an actuating device provided on the transport and assembly module, whereby the electronic device is moved in a direction that is directed out of the recess or the interior space into a contact position, in which the at least one first contact element is brought into electrical contact with at least one second contact element provided on the electrical device and
    removing the transport and assembly module.

2. The method according to claim 1, wherein the moving of the electronic device has the effect of establishing at least one of a frictional and an interlocking connection between the electronic device and the electrical device by way of at least one connecting element which has at least one ball or is formed by at least one ball.

3. The method according to claim 2, wherein
    the at least one connecting element is provided on the electrical device and
    the electronic device has a recess or a hole into which the connecting element is inserted with frictional and/or interlocking engagement.

4. The method according to claim 2, wherein the connecting element is a ball protruding from the electrical device.

5. The method according to claim 4, wherein the ball is welded on the electrical device.

6. The method according to claim 5, wherein
    the actuating device has a rotatably arranged element, and
    by turning the rotatably arranged element, a translational movement of the electronic device is produced.

7. The method according to claim 6, wherein the at least one connecting element is provided on the electrical device and a recess interacting with the connecting element is provided on the electronic device, or vice versa.

8. The method according to claim 7, wherein the electrical device is a device of a vehicle to be produced or of a vehicle component that is provided or intended for the production of a vehicle.

9. The method according to claim 8, wherein the protective element on the transport and assembly module is movable back and forth between a first position, in which access to the at least one first contact element is blocked, and a second position, in which access to the at least one first contact element is not blocked by the protective element or is enabled.

10. The method according to claim 9, wherein the protective element is arranged on the transport and assembly module.

11. The method according to claim 10, wherein the protective element is displaceable in a groove of the transport and assembly module.

12. The method according to claim 11, wherein
    a number of pin- or spike-like first contact elements protrude from the electronic device, and
    a number of second contact elements, in which one of the first contact elements are respectively receivable, are provided on the electrical device.

13. The method according to claim 12, wherein
    at least one spring element is provided,
    the electronic device is fixable in the recess or in the interior space of the transport and assembly module with one or both of frictional and interlocking engagement by the at least one spring element.

14. The method according to claim 13, wherein the at least one spring element is arranged on the electronic device.

15. A reusable transport and assembly module for transporting and installing an electronic device, comprising:
    a housing component having a recess or an interior space in which the electronic device is located or into which the electronic device is insertable, the recess or the interior space having a receptacle configured to receive an engaging element of the electronic device in one or both of frictional and interlocking engagement with the housing component;
    a protective element by which the recess or the interior space is closable when the electronic device is in the housing component, and
    an actuating device by which the electronic device is movable in a direction out of the recess or the interior space.

* * * * *